(12) United States Patent
Li et al.

(10) Patent No.: US 6,207,989 B1
(45) Date of Patent: Mar. 27, 2001

(54) NON-VOLATILE MEMORY DEVICE HAVING A HIGH-RELIABILITY COMPOSITE INSULATION LAYER

(75) Inventors: Xiao-Yu Li; Sunil D. Mehta, both of San Jose, CA (US)

(73) Assignee: Vantis Corporation, Sunnyvale, CA (US)

( * ) Notice: Subject to any disclaimer, the term of this patent is extended or adjusted under 35 U.S.C. 154(b) by 0 days.

(21) Appl. No.: 09/268,897

(22) Filed: Mar. 16, 1999

(51) Int. Cl.[7] .................................................. H01L 29/76
(52) U.S. Cl. .......................... 257/314; 257/315; 257/644
(58) Field of Search .................................. 257/314, 315, 257/644, 637, 626, 632, 635, 641, 650

(56) References Cited

U.S. PATENT DOCUMENTS

| | | | |
|---|---|---|---|
| 4,818,335 | * | 4/1989 | Karnett ................................ 257/637 |
| 5,485,035 | * | 1/1996 | Lin et al. ............................. 257/637 |
| 5,518,962 | * | 5/1996 | Murao ................................. 438/624 |
| 5,854,114 | * | 12/1998 | Li et al. .............................. 438/296 |

* cited by examiner

Primary Examiner—Sara Crane
Assistant Examiner—Thien F. Tran
(74) Attorney, Agent, or Firm—Brinks Hofer Gilson & Lione

(57) ABSTRACT

A non-volatile memory device includes a floating-gate electrode overlying a tunnel oxide layer. A portion of the floating-gate electrode forms the control gate electrode for a sense transistor that is used to determine the presence of charge on the floating-gate electrode. A composite insulation layer overlies the floating-gate electrode. The composite insulation layer includes a dielectric layer, a doped insulating layer overlying the dielectric layer, and a planarization layer overlying the doped insulating layer. The thicknesses of the dielectric layer and the doped insulating layer are precisely determined, such that the doped insulating layer getters mobile ions, such as hydrogen ions, away from the floating-gate electrode, while not capacitively coupling with the floating-gate electrode. In a preferred embodiment of the invention, the dielectric layer has a thickness of about 450 to about 550 Å, and the doped insulating layer has a thickness of about 2900 to about 3100 Å, and the planarization layer has a thickness of about 6000 to 8000 Å.

18 Claims, 2 Drawing Sheets

NON-VOLATILE MEMORY DEVICE HAVING A HIGH-RELIABILITY COMPOSITE INSULATION LAYER

FIELD OF THE INVENTION

This invention relates, in general, to non-volatile memory devices and more particularly, to non-volatile memory devices having composite insulation layers.

BACKGROUND OF THE INVENTION

State of the art non-volatile memory devices are typically constructed by fabricating a floating-gate transistor in a silicon substrate. The floating-gate transistor is capable of storing electrical charge either on a separate gate electrode, known as a floating-gate, or in a dielectric layer underlying a control gate electrode. Data is stored in a non-volatile memory device by the storage of electrical charge in the floating-gate. For example, in an n-channel EEPROM (electrically-erasable-programmable-read-only-memory) device, an accumulation of electrons in a floating-gate electrode changes the threshold voltage in the floating-gate transistor.

One particular type of non-volatile memory device is the flash EEPROM. In a flash EEPROM device, electrons are transferred to the floating-gate electrode through a thin dielectric layer, known as a tunnel-oxide layer, located between the floating-gate electrode and the underlying substrate. Typically, the electron transfer is carried out either by hot electron injection, or by Fowler-Nordheim tunneling. In either electron transfer mechanism, a voltage is coupled to the floating-gate electrode by a control-gate electrode. The control-gate electrode is capacitively coupled to the floating-gate electrode, such that a voltage applied to the control-gate electrode is coupled to the floating-gate electrode. In one type of device, the control-gate electrode is a polycrystalline silicon gate electrode overlying the floating-gate electrode, and separated therefrom by a dielectric layer. In another type of device, the floating-gate electrode is a doped region in the semiconductor substrate.

The flash EEPROM device is programmed by applying a high positive voltage to the control-gate electrode, and a lower positive voltage to the drain region of the floating-gate transistor. These applied potentials transfer electrons from the substrate through the tunnel oxide layer and to the floating-gate electrode. Conversely, the EEPROM device is erased by grounding the control-gate electrode, and applying a high positive voltage to either the source or drain region of the floating-gate transistor. Under erase voltage conditions, electrons are removed from the floating-gate electrode and enter either source or drain regions in the semiconductor substrate.

Another type of EEPROM device is extensively used in programmable logic devices (PLDs). EEPROM cells formed in PLDs include three transistors: a write transistor, a read transistor, and a sense transistor. In PLD EEPROM cells, the control gates of the write transistor and read transistor are connected to the same wordline. Also, in PLD EEPROM cells, the read transistor and the sense transistor are connected to the same bitline. When the read transistor is turned on, the common bitline connection permits the sense transistor to be effectively used as the storage cell of the EEPROM.

In operation, to program PLD EEPROMs, a high voltage (between 13 and 15 volts) is applied to the wordline of the EEPROM cell. A relatively high voltage (approximately 11 to 12 volts) is applied to the control gate of the write transistor, allowing voltage applied on the bitline to be transferred to the control gate of the sense transistor. The application of such high voltage levels is a write condition that results in data being stored in the EEPROM cell.

To erase the EEPROM cell, a voltage $V_{cc}$ is applied to the wordline of the write transistor, which also causes the read transistor to turn on. Ground potential is applied to the bitline, which is connected to the drain of the read transistor. A high voltage (between 13 to 15 volts) is applied on the capacitor coupled control gate (ACG). Under this bias condition, the high voltage applied to ACG is coupled to the floating-gate of the sense transistor and the EEPROM cell is erased by the transfer of electrons through the tunnel oxide layer from the floating-gate to the substrate.

It is known that charge loss from a floating gate of a cell of a non-volatile memory device or a PLD is caused, in part, by positive ions (such as hydrogen) which are disposed in the oxide layer surrounding the floating gate. These positive ions are free to combine with electrons collected on the floating-gate. The combination of positive ions with electrons results in a net charge loss from the floating-gate and weakens the data retention capability of a non-volatile memory device or a PLD. It is widely believed that high temperatures (e.g., temperatures above 200° C.) increase the diffusivity of such positive ions in the oxide layer, which increases the rate of ion-electron combinations thereby accelerating the charge loss from the floating-gate. When charge leaks off the floating-gate electrode, a data error occurs in the memory cell.

In addition to charge loss, data errors can also arise from excess charge accumulation of the floating-gate. Unwanted capacitive coupling with electrically conductive structures in close proximity to the floating-gate can induce excess charge build up in the floating-gate. The accumulation of charge cases the threshold voltage of the floating-gate transition (or the sense transistor in a PLD) to shift away from the originally designed valve. Once the threshold voltage shifts away from the designed value, the floating-gate transistor cannot be turned on by application of a typical read voltage applied to the floating-gate electrode. When this happens, a read error occurs and an incorrect logic signal is transmitted from the memory cell.

Both charge leakage and threshold voltage instability produce data errors during operation of the EEPROM cell. Depending upon the particular function performed by the non-volatile memory device, the data error can cause catastrophic failure in an electronic system relying upon the device. Accordingly, an improved non-volatile memory device is necessary to provide a high-reliability device that exhibits stable threshold voltage values.

SUMMARY OF THE INVENTION

The present invention is for a non-volatile memory device having a high-reliability composite insulation layer that exhibits improved data retention. The device includes a composite insulation layer that getters mobile ions, such as hydrogen ions, introduced into the device during processing. The composite insulation layer is designed to getter mobile ions, while avoiding capacitative coupling with the floating-gate electrode. The relative thicknesses of the individual layers within the composite insulation layer are precisely determined, such that the layer gettering mobile ions is sufficiently proximate to the floating-gate electrode to prevent mobile ions from diffusing to the floating-gate electrode. Additionally, the relative thicknesses of the individual layers within the composite insulation layer are defined so as to provide dielectric insulation between the gettering source and the floating-gate electrode. The dielectric insulation is necessary to avoid capacitative coupling of the gettering source with the floating-gate electrode. Capacitative coupling of the gettering source with the floating-gate electrode can result in undesirable charge buildup within the floating-gate electrode.

In one form, a semiconductor substrate is provided having a device layer thereon. A composite insulation layer overlies the device layer. The composite insulation layer includes a first undoped dielectric layer, a doped insulating layer overlying the first undoped dielectric layer, and a second undoped dielectric layer overlying the doped insulating layer. The first undoped dielectric layer has a thickness of about 450 to about 550 Å, the doped insulating layer has a thickness of about 2900 to about 3100 Å, and the second undoped dielectric layer has a thickness of about 6000 to 8000 Å.

It will be appreciated that for simplicity and clarity of illustration, elements shown in the Figures have not necessarily been drawn to scale. For example, the dimensions of some of the elements are exaggerated relative to each other for clarity. Further, where considered appropriate, reference numbers have been repeated among the Figures to indicate corresponding elements.

DETAILED DESCRIPTION OF PREFERRED EMBODIMENTS

Figure 1:
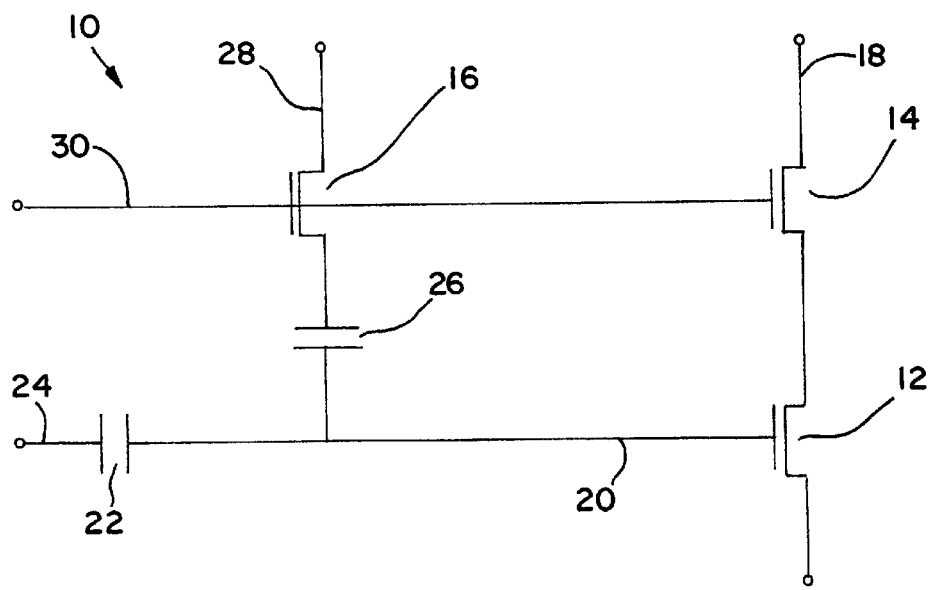
FIG. 1 is a schematic circuit diagram of a non-volatile memory cell.

Shown in FIG. 1 is a schematic circuit diagram of a non-volatile memory cell 10. Memory cell 10 includes a floating-gate sense transistor 12, a read transistor 14, and a program transistor 16. Read transistor 14 has its drain connected to a readline 18 and its source connected to the drain of the sense transistor 12. Sense transistor 12 includes a floating-gate electrode 20 capacitively coupled via a gate oxide layer 22 to a control gateline 24. Sense transistor 12 is also capacitively coupled via a tunnel oxide layer 26 to the source of program transistor 16. Program transistor 16 has its drain connected to a program line 28 and its gate connected to a wordline 30. Wordline 30 also forms the gate of read transistor 14.

Figure 2:
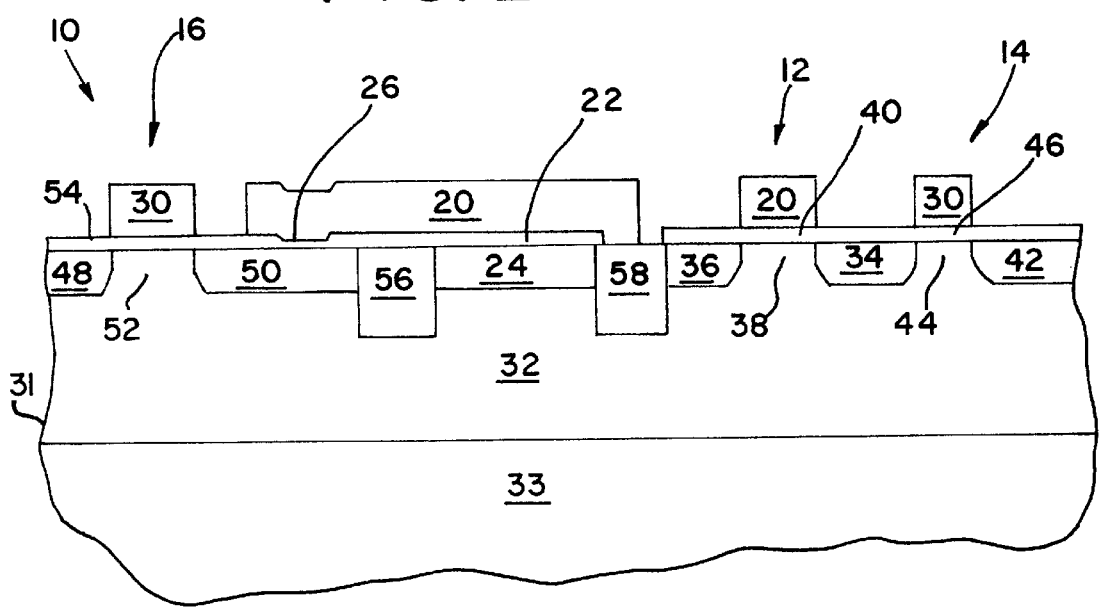
FIG. 2 illustrates, in cross-section, the electrodes of the non-volatile memory cell shown in FIG. 1 and arranged in accordance with the invention.

FIG. 2 illustrates, in cross-section, a portion of a semiconductor substrate 31 supporting the electrodes of memory cell 10. Sense transistor 12 includes a drain region 34 and a source region 36. A channel region 38 separates drain region 34 from source region 36. A gate oxide layer 40 overlies channel region 38 and separates floating-gate 20 from channel region 38. Read transistor 14 includes a drain region 42 and utilizes drain region 34 of sense transistor 12 as a source region. A channel region 44 separates drain region 42 from drain/source region 34. A gate oxide layer 46 overlies channel region 44 and separates wordline 30 from channel region 44. Program transistor 16 includes a drain region 48 and a source region 50. A channel region 52 separates drain region 48 from source region 50. A gate oxide layer 54 overlies channel region 52 and separates wordline 30 from channel region 52. Source region 50 also functions as a programmable junction region that is used as a source of electrons for programming non-volatile memory device 10. Floating gate electrode 20 overlies gate oxide layer 22 and tunnel oxide layer 26. Control line 24 resides in semiconductor substrate 32 intermediate to first and second field isolation regions 56 and 58. Field isolation regions 56 and 58 electrically isolate control gateline 24 from sense transistor 12 and program transistor 16.

Those skilled in the art will recognize the non-volatile memory device shown in FIGS. 1 and 2 as the operative elements of a memory cell used in a PLD. In operation, voltage can be capacitively coupled from control gateline 24 to floating gate electrode 20 across gate oxide layer 22. Then, when a proper voltage is applied to program junction 50, electrons tunnel across tunnel oxide layer 26 and into floating-gate electrode 20. The presence or absence of charge on floating-gate electrode 20 is determined by the presence or absence of a current flow in sense transistor 12. Typically, sense transistor 12 is a depletion-mode transistor that is normally in an on-state. When a sufficient amount of electrical charge is placed on floating-gate electrode 20, the threshold voltage of sense transistor 12 is exceeded, which forms a depletion layer in channel region 38. Formation of the depletion layer stops the flow of electrical current through sense transistor 12.

Because of the high voltage needed to program and erase non-volatile memory cell 10, program transistor 16 is a high-voltage transistor having a relatively thick gate oxide layer. In a preferred embodiment of the invention, gate oxide layer 54 has a thickness of about 140 to 160 Å, and more preferably about 150 Å. Additionally, because of the relatively high voltage levels experienced by floating-gate electrode 20, gate oxide layers 22 and 40 are also in the range of preferably about 150 Å. In contrast, tunnel oxide layer 26 and gate oxide layer 46 are considerably thinner than the oxide layers in the high voltage transistors. For example, tunnel oxide layer 26 is preferably about 70 to 90 Å, and more preferably about 80 Å thick. Similarly, gate oxide layer 46 of read transistor 14 has a thickness of preferably about 80Å

For an n-channel non-volatile memory, or PLD, semiconductor substrate 31 is of p-type conductivity, while the source and drain regions and control gate are of n-type conductivity. Preferably, semiconductor substrate 31 includes a p−region 32 overlying a p+region 33. Preferably, p−region 32 is preferably formed by epitaxial deposition of p-type, single-crystal silicon over a p-type substrate. Those skilled in the art will appreciate that a p-type memory device can also be formed, in which the conductivity type of the substrate and electrode regions are reversed.

To function properly, the charge control capacitor that includes control gateline 24 as a first terminal and floating-gate electrode 20 as a second terminal must capacitively couple with floating-gate electrode 20 to initiate charge flow in the programming capacitor. The programming capacitor includes program junction 50 as a first terminal and floating-gate electrode 20 as a second terminal. Unwanted compacitative coupling with control-gate electrode 20 from other sources can alter the charge level of the floating-gate electrode. When this happens, the presence or absence of current flow in sense transistor 12 becomes an imprecise measure of the presence or absence of charge on floating-gate electrode 20. Accordingly, it is important that layers of material capable of holding an electrical charge not be placed in close proximity to floating-gate electrode 20.

An additional concern for the proper functioning of non-volatile memory cell 10 includes the need to getter mobile ions away from floating-gate electrode 20. As previously described, positive ions combining with electrons can result in a net charge loss from the floating-gate electrode. Thus, it is necessary to place a mobile ion gettering layer in proximity to floating-gate electrode 20. An important feature of the present invention includes the precise formation of dielectric and charge gettering layers, such that mobile ions are gettered away from floating-gate electrode 20, while avoiding charge coupling of the gettering layer with floating-gate electrode 20.

Figure 3:
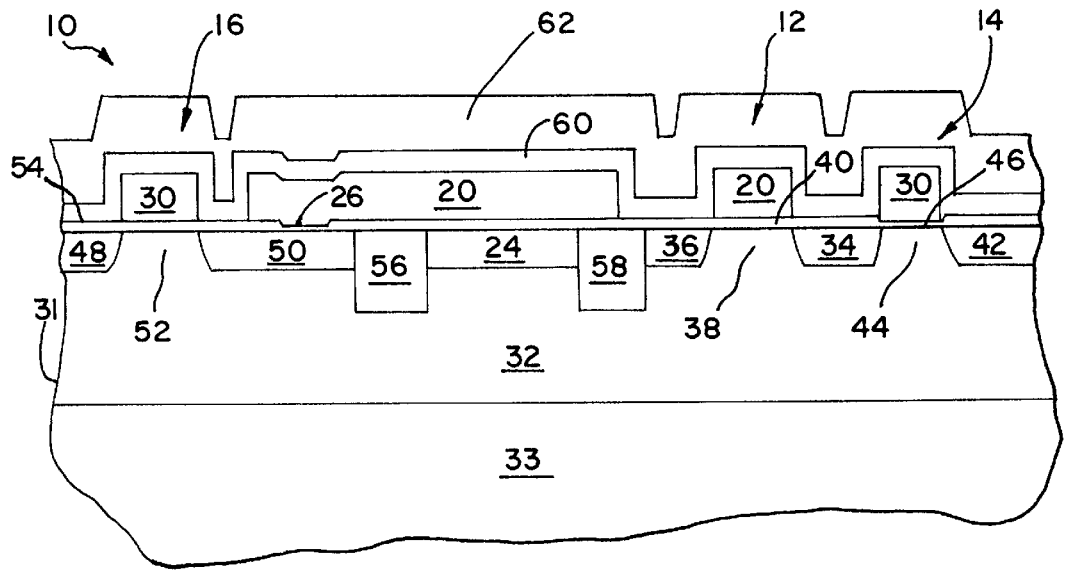
FIG. 3 illustrates, in cross-section, a dielectric layer and a doped insulating layer formed in accordance with the invention and overlying the electrode layer.
Figure 4:
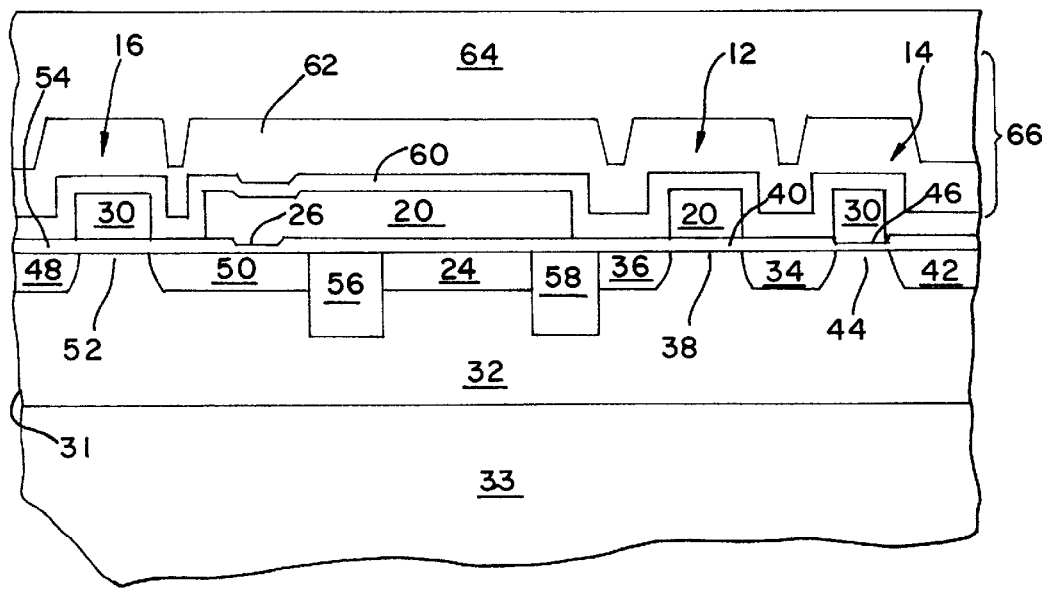
FIG. 4 illustrates, in cross-section, a composite insulation layer formed in accordance with the invention and overlying the device layer of a non-volatile memory cell.

In accordance with the invention, a composite insulation layer is fabricated using dielectric and doped insulating material that function to getter mobile ions, while preserving the charge integrity of floating-gate electrode 20. As illustrated in FIG. 3, a dielectric layer 60 overlies substrate 32 and conformly covers floating-gate electrode 20 and wordline 30. In a preferred embodiment of the invention, dielectric layer 60 is a tetraethylorthosilicate (TEOS) layer deposited to a thickness of preferably about 450 to 550 Å, and more preferably to about 500 Å. The TEOS material is deposited by chemical-vapor-deposition (CVD) using tetraethylorthosilane. The TEOS material formed by CVD conformally deposits over the surface of semiconductor substrate 32 creating a layer of uniform thickness across the device electrodes and on the surface of semiconductor substrate 32.

Once dielectric layer 60 is deposited, a doped insulating layer 62 is deposited to overlie dielectric layer 60. Preferably, doped insulating layer 62 is a silicate glass layer doped with an n-type dopant, such as phosphorus. Preferably, doped insulating layer 62 is a phosphorus-silicate-glass (PSG) layer deposited by CVD to a thickness of preferably about 2900 to 3100 Å and, more preferably, to about 3000 Å. Doped insulating layer 62 provides a gettering layer to getter mobile ions, such as hydrogen ions, away from floating-gate electrode 20. Although the preferred method for forming doped insulating layer 62 is CVD, other techniques, such as atmospheric deposition, and the like, can also be used. Importantly, doped insulating layer 62 cooperates with dielectric layer 60 to ensure optimal performance of non-volatile memory cell 10. In particular, doped insulating layer 62 must be positioned close enough to floating-gate electrode 20, such that mobile ions will be trapped in doped insulating layer 62 prior to reaching floating-gate electrode 20. Correspondingly, dielectric layer 60 must be thick enough to prevent a capacitative coupling between the charge in doped insulating layer 62 and floating-gate electrode 20.

After forming dielectric layer 60 and doped insulating layer 62, a planarization layer 64 is deposited to overlie doped insulating layer 62. Preferably, planarization layer 64 is also a TEOS material formed by CVD. In a preferred embodiment, planarization layer 64 is deposited to a thickness of about 10,000 Å. Planarization layer 64 uniformly covers the steep topographical contrast of underlying layers 62 and 60. A smooth surface can be formed in planarization layer 64 by use of a conventional planarization technique, such as chemical-mechanical-polishing (CMP), or an etchback process, or the like.

Following the formation of planarization layer 64, a composite insulation layer 66 is complete and includes dielectric layer 60, doped insulating layer 62, and planarization layer 64. Although the fabrication method for forming the individual layers within composite insulation layer 66 have been described with particular detail to certain processes, it is to be understood that a number of different semiconductor fabrication techniques could be employed to form the various layers of composite insulation layer 66. Additionally, those skilled in the art will appreciate that in a state of the art non-volatile memory device, multiple levels of metal interconnects are used to electrically interconnect the various components of an integrated circuit device. Accordingly, via openings and contact openings are formed in composite insulation layer 66 for the fabrication of metallized contact structures.

To determine the dependence of a charge leakage on the relative thickness of the dielectric and doped insulating layer, an experiment was carried out with test samples formed according to the prior art and with test samples formed according to the invention. The devices fabricated in accordance with the prior art included a two-layer insulation structure fabricated with a dielectric layer having a thickness of about 3600 Å and a doped insulating layer have a thickness of about 14,000 Å. The prior art devices do not include an undoped TEOS layer overlying the doped insulating layer. The amount of charge on the floating-gate electrode was determined by applying a varying amount of voltage to the substrate until current flow was detected. At that point, the applied voltage was measured for each sample. Then, the samples were baked at a temperature of about 250° C. for about 91 hours. Following the high temperature bake, the voltage on the floating-gate electrode was again measured by applying a voltage to the substrate. The difference in the amount of charge measured before and after the high temperature bake, indicates the amount of charge leakage in the devices.

The sensitivity of a non-volatile memory device, such as a PLD, to variations in the thickness of dielectric layer 60 and doped insulating layer 62 is shown in the Table below.

TABLE

| Voltage measurements of floating-gate before and after 250° C. bake for 91 hours Thickness TEOS/PSG/Planarization (Å) | | |
| --- | --- | --- |
| | 500/3000/7000 | 3600/14,000/0 |
| Voltage Change (ΔV) | 0.1675 | 1.6022 |
| | 0.1400 | 1.5972 |

The Table shows the amount of charge leakage experienced by devices fabricated in accordance with the invention and by devices fabricated in accordance with the prior art. The data shown in the Table represents the change in voltage on the floating-gate measured for each device. As indicated in the Table, the devices fabricated in accordance with the invention show a very small change in voltage, while the devices fabricated in accordance with the prior art show about ten times the amount of charge leakage as compared to the devices fabricated in accordance with the invention. The data shown in the Table illustrates the extreme sensitivity of non-volatile memory devices, such as devices to the thicknesses of the individual layers within a composite insulation layer, such as composite insulation layer 66.

Thus, it is apparent that there has been disclosed a non-volatile memory device having a high reliability composite insulation layer that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the wordline and the floating-gate electrode can be fabricated from a number of materials, including polycrystalinesilicon, a refractory-metal silicide, and the like. It is therefore intended to include within the invention all such variations and modifications as fall within the scope of the appended claims and equivalence thereof.

What is claimed is:

1. A semiconductor device including capacitive memory cells, the device comprising:
   a semiconductor substrate having a capacitive memory cell thereon;
   an insulation layer overlying the capacitive memory cell, wherein the insulation layer includes a first undoped dielectric layer, a doped insulating layer overlying the first undoped dielectric layer, and a second undoped dielectric layer overlying the doped insulating layer,
   wherein the first undoped dielectric layer has a thickness of about 450 to 550 Å to prevent capacitive coupling between the doped insulating layer and the capacitive memory cell,
   wherein the doped insulating layer has a thickness of about 2900 to 3100 Å to getter mobile ions away from the capacitive memory cell, and
   wherein the second undoped dielectric layer has a thickness of about 6000 to 8000Å.

2. The device of claim 1, wherein the first and second undoped dielectric layers comprise layers of TEOS oxide.

3. The device of claim 1, wherein the doped insulating layer comprises phosphorus-silicate-glass.

4. The device of claim 1, wherein the first undoped dielectric layer has a thickness of about 500 Å, the doped insulating layer has a thickness of about 3000 Å, and the second undoped dielectric layer has a thickness of about 7000Å.

5. The device of claim 1, wherein the device layer comprises a floating-gate electrode overlying a tunnel oxide layer.

6. The device of claim 1, wherein the device layer comprises components of a programmable logic device.

7. A semiconductor device comprising:
   a semiconductor substrate having a tunnel oxide layer thereon;
   a floating-gate electrode overlying the tunnel oxide layer;
   a first silicon oxide layer overlying the floating-gate electrode;
   a doped glass layer overlying the first silicon dioxide layer; and
   a second silicon oxide layer overlying the doped glass layer,
   wherein the first silicon oxide layer has a thickness of about 450 to 550 Å to prevent capacitive coupling between the doped insulating layer and the floating gate electrode,
   wherein the doped glass layer has a thickness of about 2900 to 3100 Å to getter mobile ions away from the floating-gate electrode, and
   wherein the second silicon oxide layer has a thickness of about 6000 to 8000 Å.

8. The device of claim 7 further comprising a planarization layer overlying the doped glass layer.

9. The device of claim 7, wherein the first silicon oxide layer comprises a TEOS oxide layer having a thickness of about 500 Å and the doped glass layer comprises a PSG layer having a thickness of about 3000Å.

10. The device of claim 7, wherein the tunnel oxide layer comprises thermal silicon oxide having a thickness of no more than about 100Å.

11. The device of claim 7 further comprising a sense transistor including a channel region and a gate oxide layer overlying the channel region, wherein a portion of the floating-gate electrode overlies the gate oxide layer and functions as a gate electrode for the sense transistor.

12. The device of claim 11, wherein the mobile ions comprise hydrogen ions.

13. A programmable logic device comprising:
   a write transistor;
   a read transistor having a gate electrode;
   a word line forming a gate electrode for the write transistor and for the read transistor;
   a sense transistor electrically coupled to the read transistor;
   a floating-gate electrode forming a gate electrode for the sense transistor;
   a programming capacitor having a first terminal electrically coupled to the write transistor and a second terminal integral with the floating-gate electrode;
   a charge control capacitor having a first terminal and a second terminal integral with the floating-gate electrode;
   a first dielectric layer overlying at least the floating-gate electrode;
   a doped insulating layer overlying the first dielectric layer;
   a second dielectric layer overlying the doped insulating layer,
   wherein the first dielectric layer has a thickness of about 450 to 550 Å, the doped insulating layer has a thickness of about 2900 to 3100 Å, and the second dielectric layer has a thickness of about 6000 to 8000 Å, and
   wherein the thickness of the first dielectric layer and the thickness of the doped insulating layer is such that the doped insulating layer getters mobile ions away from the floating-gate electrode and the gate electrode remains free of capacitive coupling with the doped insulation layer.

14. The device of claim 13 further, wherein the second dielectric layer comprises a planarization layer.

15. The device of claim 14, wherein the first dielectric layer and the second dielectric layer comprise layers of TEOS oxide.

16. The device of claim 15, wherein the doped insulating layer comprises phosphorus-silicate-glass.

17. The device of claim 13, wherein the programming capacitor further comprises a tunnel oxide layer intermediate to the first and second terminals and wherein the tunnel oxide layer has a thickness of no more than about 100Å.

18. The device of claim 13, wherein the first dielectric layer comprises a TEOS oxide layer having a thickness of about 500 Å, the doped insulating layer comprises a PSG layer having a thickness of about 3000 Å, and the second dielectric layer comprises a TEOS oxide layer having a thickness of about 7000 Å.

* * * * *